United States Patent
Crane et al.

(10) Patent No.: US 6,313,395 B1
(45) Date of Patent: Nov. 6, 2001

(54) INTERCONNECT STRUCTURE FOR SOLAR CELLS AND METHOD OF MAKING SAME

(75) Inventors: Richard A. Crane, La Honda; Matthew B. Piper, San Jose; Shandor G. Daroczi, Santa Clara, all of CA (US)

(73) Assignee: SunPower Corporation, Sunnyvale, CA (US)

( * ) Notice: Subject to any disclaimer, the term of this patent is extended or adjusted under 35 U.S.C. 154(b) by 0 days.

(21) Appl. No.: 09/558,409

(22) Filed: Apr. 24, 2000

(51) Int. Cl.[7] ............................. H01L 31/05; B21F 3/04
(52) U.S. Cl. .................. 136/244; 136/261; 136/251; 136/291; 136/256; 136/293; 72/135; 72/136; 72/146; 29/825; 29/850; 439/32; 439/775; 439/954
(58) Field of Search ................... 136/244, 261, 136/251, 291, 256, 293; 72/135, 136, 146; 29/825, 850; 439/32, 775, 816, 954

(56) References Cited

U.S. PATENT DOCUMENTS

| | | | |
|---|---|---|---|
| 4,044,583 | * 8/1977 | Kinney, Jr. | 72/137 |
| 4,845,723 | * 7/1989 | Heinen et al. | 372/38.02 |
| 5,158,618 | * 10/1992 | Rubin et al. | 136/244 |
| 5,632,086 | * 5/1997 | Helwig | 29/896.43 |
| 5,776,334 | * 7/1998 | Cho | 210/138 |

* cited by examiner

*Primary Examiner*—Alan Diamond
(74) *Attorney, Agent, or Firm*—Townsend and Townsend and Crew LLP; Henry K. Woodward

(57) ABSTRACT

An interconnect structure for use with solar cells and like devices which are subject to compressive and/or expansive forces through packaging or in application comprises a flattened spiral of a metal strip. The interconnect is fabricated by first providing a length of metal strip, wrapping the metal strip around a cylindrical or flat mandrel or otherwise folded in a helical pattern, removing the mandrel, and then flattening the metal strip to reduce thickness of the interconnect.

13 Claims, 2 Drawing Sheets

INTERCONNECT STRUCTURE FOR SOLAR CELLS AND METHOD OF MAKING SAME

BACKGROUND OF THE INVENTION

This invention relates generally to electrical interconnect structures, and more particularly the invention relates to interconnects which are subject to compressive and/or expansive forces in application.

Solar cell modules are used in high altitude and space applications where temperature subjects the modules to shrinkage. Further, in some applications planar arrays of solar cell submodules are packaged in a laminate structure between two layers of laminate material which shrink during packaging. The planar arrays are submodules containing a plurality of semiconductor substrates in which the solar cells are fabricated, and the substrates are serially electrically connected between bus bars which receive solar generated voltages. The interconnects typically comprise a metal layer of foil which is soldered or welded to contacts on adjacent substrates or between a substrate and a bus.

The shrinkage of the packaged modules can cause buckling of the metal foil interconnects and create ripples or an unevenness in the surface of the planar arrays. In some space applications the unevenness has deleterious effects. Heretofore, a through hole pattern has been used in foil interconnecting two substrates to reduce buckling, but the peripheral or bus interconnect must be a solid foil which does not permit use of the through hole pattern. Attempts at reducing buckling of the peripheral interconnect by embossing or by folding the foil have not been successful.

The present invention is directed to providing a metal foil peripheral or bus interconnect which reduces buckling when subjected to expansion and shrinkage.

SUMMARY OF THE INVENTION

Briefly, the bus interconnect comprises a flattened spiral of a strip of metal foil which allows for contraction without significant buckling.

In fabricating the bus interconnect, a strip of metal foil such as silver, for example, is wrapped around a cylindrical mandrel in a helical pattern with controlled pitch and tension. The mandrel is then removed leaving the helical spiral of foil. The foil is then flattened to reduce the thickness of the bus interconnect. The bus interconnect can also be formed by wrapping the foil around a flat mandrel or by directly folding into a flattened spiral.

The invention and objects and features thereof would be more readily apparent from the following detailed description and appended claims when taken with the drawing.

DETAILED DESCRIPTION OF ILLUSTRATIVE EMBODIMENTS

Figure 1:
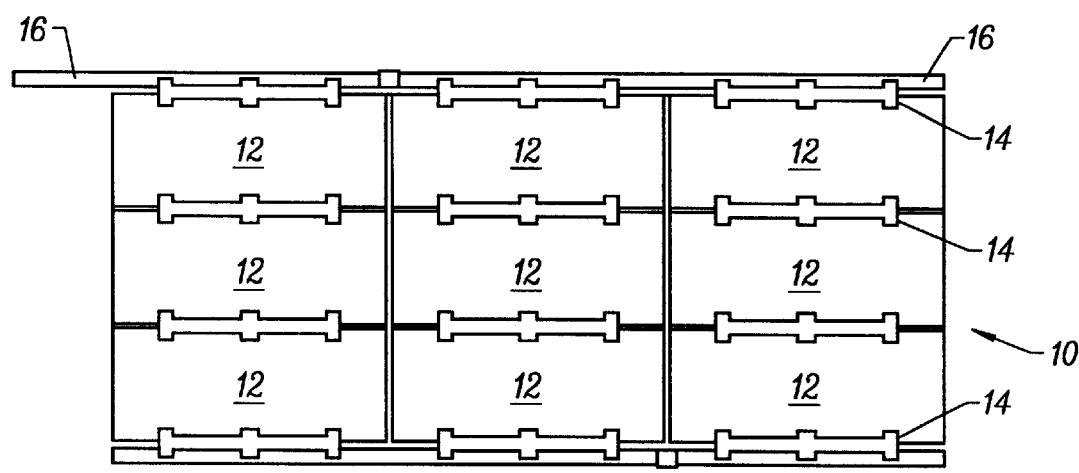
FIG. 1 illustrates a plan view of a conventional solar cell submodule of interconnected silicon substrates and a connected bus.

Referring now to the drawings, FIG. 1 is a plan view of a conventional solar cell submodule shown generally at 10 comprising a plurality of silicon substrates 12 in which solar cells are fabricated. While three columns of three substrates are illustrated, the number of columns and substrates in each column can be of any desired number. The substrates 12 in each column are electrically interconnected by a foil interconnect 14 with the top and bottom substrates 12 being interconnected to peripheral interconnects or buses 16. As noted above, a through hole pattern has been used in the foil interconnects 14 to reduce buckling of the foils, but the peripheral or bus interconnects 16 must be a solid foil not permitting use of a perforated through hole pattern.

The shrinkage of the packaged modules can cause buckling of the metal foil interconnects and create a ripple or unevenness in the surface of the planar arrays. In some high altitude and space applications the unevenness has deleterious effects, especially when the solar cells are placed on the surfaces of air foils of airplanes. Attempts at reducing buckling of the peripheral interconnects by embossing or folding the foil have been unsuccessful.

Figure 2:
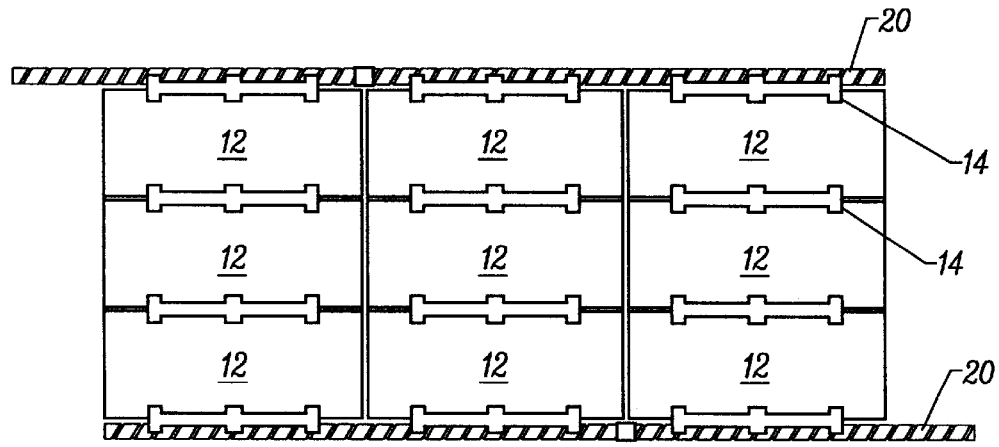
FIG. 2 is a planar view of a solar cell submodule of interconnected silicon substrates and a connected bus in accordance with one embodiment of the invention.

In accordance with the present invention, the peripheral interconnects comprise a flattened spiral of a metal strip which allows for contraction of the interconnect without significant buckling, as illustrated at 20 in FIG. 2. FIG. 2 is a plan view of the solar cell array of FIG. 1 except for the peripheral interconnects 20 in accordance with the invention. In one embodiment, the flattened spiral metal strip was fabricated from a silver foil of 0.150 inch in width and 0.002 inch in thickness.

Figure 3:
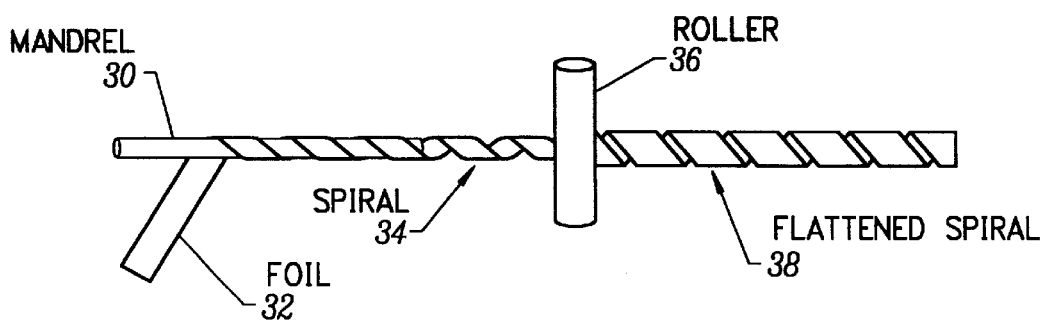
FIG. 3 illustrates one fabrication example of an interconnect in accordance with the invention.

One fabrication example of the helical spiral is illustrated in FIG. 3 in which a 0.09 inch diameter mandrel 30 is used for wrapping the silver foil 32 with controlled pitch and tension. After the foil is wrapped around the mandrel, the mandrel is removed leaving a hollow spiral of foil as shown at 34. The foil is then flattened by a roller or press 36, thus forming the finished spiral flex foil lead 38 which has a width of 0.150 inch and a thickness of 0.004 inch.

The flattened spiral of a metal strip has proved effective as a peripheral or bus interconnect in a solar cell subject to shrinkage without undue buckling of the foil interconnect. While the invention has been described with reference to a specific embodiment the description is illustrative of the invention and is not to be construed as limiting the invention. Various modifications and applications may occur to those skilled in the art without departing from the true spirit and scope of the invention as defined by the appended claims.

What is claimed is:

1. A solar cell module comprising
   (a) a plurality of silicon substrates with each substrate including solar cells and electrical contacts,
   (b) a plurality of first interconnects connecting contacts of adjacent silicon substrates, and
   (c) a flexible peripheral interconnect connected to at least one silicon substrate and comprising a flattened spiral of a metal strip which allows for contraction and expansion of the interconnect without significant buckling.

2. The solar cell module as defined by claim 1 wherein the metal strip comprises silver foil.

3. The solar cell module as defined by claim 2 wherein the metal strip comprises a silver foil having a width of about 0.150 inch and a thickness of about 0.002 inch.

4. The solar cell module as defined by claim 3 wherein the spiral prior to flattening has a diameter of about 0.090 inch and the flattened spiral is about 0.150 inch wide and 0.004 inch in thickness.

5. The solar cell module as defined by claim 3 wherein the first plurality of interconnects comprises a silver foil with a perforated through hole pattern therein to accommodate contraction and expansion of module components.

6. The solar cell module as defined by claim 5 and further including a laminate housing for the module.

7. The solar cell module as defined by claim 6 wherein the laminate housing comprises two layers of a fluoro-plastic film.

8. The solar cell module as defined by claim 1 wherein the first plurality of interconnects comprises a metal foil with a perforated through hole pattern therein to accommodate contraction and expansion.

9. The solar cell module as defined by claim 8 and further including a laminate housing for the module.

10. The solar cell module as defined by claim 9 wherein the laminate housing comprises two layers of fluoro-plastic film.

11. The solar cell module as defined by claim 1 and further including a laminate housing for the module.

12. The solar cell module as defined by claim 11 wherein the laminate housing comprises two layers of fluoro-plastic film.

13. A method of fabricating an electrical interconnect for use in an application which subjects the interconnect to contraction comprising the steps of:
  (a) providing a metal strip,
  (b) wrapping the metal strip around a cylindrical mandrel in a helical spiral pattern,
  (c) removing the mandrel, and
  (d) flattening the metal spiral to reduce thickness of the interconnect.

* * * * *